(12) United States Patent
Bayerle et al.

(10) Patent No.: US 11,903,472 B2
(45) Date of Patent: *Feb. 20, 2024

(54) HAIR IRON HAVING A CERAMIC HEATER

(71) Applicant: LEXMARK INTERNATIONAL, INC., Lexington, KY (US)

(72) Inventors: Peter Alden Bayerle, Lexington, KY (US); Russell Edward Lucas, Lexington, KY (US); Jerry Wayne Smith, Irvine, KY (US)

(73) Assignee: LEXMARK INTERNATIONAL, INC., Lexington, KY (US)

( * ) Notice: Subject to any disclaimer, the term of this patent is extended or adjusted under 35 U.S.C. 154(b) by 915 days.

This patent is subject to a terminal disclaimer.

(21) Appl. No.: 16/782,308

(22) Filed: Feb. 5, 2020

(65) Prior Publication Data

US 2020/0253350 A1  Aug. 13, 2020

Related U.S. Application Data

(60) Provisional application No. 62/802,945, filed on Feb. 8, 2019.

(51) Int. Cl.
| | | |
|---|---|---|
| *A45D 1/04* | (2006.01) | |
| *A45D 1/06* | (2006.01) | |
| *A45D 1/00* | (2006.01) | |
| *A45D 1/28* | (2006.01) | |
| *H05B 3/26* | (2006.01) | |

(52) U.S. Cl.
CPC ............. *A45D 1/04* (2013.01); *A45D 1/06* (2013.01); *A45D 1/28* (2013.01); *A45D 2001/004* (2013.01); *H05B 3/265* (2013.01)

(58) Field of Classification Search
None
See application file for complete search history.

(56) References Cited

U.S. PATENT DOCUMENTS

| | | |
|---|---|---|
| 3,878,362 A | 4/1975 | Stinger |
| 4,222,026 A | 9/1980 | Heiney, III et al. |
| 4,733,056 A | 3/1988 | Kojima et al. |
| 5,221,829 A | 6/1993 | Yahav et al. |

(Continued)

FOREIGN PATENT DOCUMENTS

| | | |
|---|---|---|
| CN | 2502618 Y | 7/2002 |
| CN | 2847768 Y | 12/2006 |

(Continued)

OTHER PUBLICATIONS

EPO machine translation of WO 2012139958 A1 (Copitzky et al.).

(Continued)

*Primary Examiner* — Joseph M. Pelham

(57) ABSTRACT

A hair iron according to one example embodiment includes a first arm and a second arm movable relative to each other between an open position and a closed position. A contact surface is positioned on an exterior of the first arm for contacting hair during use. The hair iron includes a heater having a ceramic substrate and an electrical resistor material thick film printed on a surface of the ceramic substrate. The heater generates heat by applying an electric current to the electrical resistor material. The heater is positioned to supply heat to the contact surface.

20 Claims, 8 Drawing Sheets

(56) References Cited

U.S. PATENT DOCUMENTS

| | | |
|---|---|---|
| 5,581,876 A | 12/1996 | Prabhu et al. |
| 5,663,702 A | 9/1997 | Shaw, Jr. et al. |
| 5,968,391 A | 10/1999 | Deo et al. |
| 6,222,158 B1 | 4/2001 | Nakata et al. |
| 6,433,317 B1 | 8/2002 | Arx et al. |
| 6,518,549 B1 | 2/2003 | Taylor et al. |
| 6,960,741 B2 | 11/2005 | Hamilton et al. |
| 7,005,611 B2 | 2/2006 | Hamilton et al. |
| 7,241,131 B1 | 7/2007 | Booth et al. |
| 7,336,919 B2 | 2/2008 | Beach et al. |
| 7,352,988 B2 | 4/2008 | Beach et al. |
| 7,671,300 B2 | 3/2010 | Lucas et al. |
| 8,064,816 B2 | 11/2011 | Campbell et al. |
| 9,417,572 B2 | 8/2016 | Hamilton et al. |
| 9,551,962 B2 | 1/2017 | Campbell et al. |
| 9,848,683 B2 | 12/2017 | Sayers et al. |
| 10,025,244 B2 | 7/2018 | Campbell et al. |
| 10,274,876 B2 | 4/2019 | Cao et al. |
| 2002/0145134 A1 | 10/2002 | Olding et al. |
| 2003/0186183 A1* | 10/2003 | Ito .................. H01L 21/6831 432/253 |
| 2004/0149718 A1 | 8/2004 | Ito et al. |
| 2005/0205548 A1 | 9/2005 | Olding et al. |
| 2006/0065654 A1 | 3/2006 | Ptasienski |
| 2006/0096084 A1 | 5/2006 | Hamilton et al. |
| 2006/0127686 A1 | 6/2006 | Meloni |
| 2007/0119844 A1 | 5/2007 | Lo et al. |
| 2007/0278203 A1 | 12/2007 | Creteau et al. |
| 2008/0083733 A1 | 4/2008 | Takai et al. |
| 2008/0224786 A1 | 9/2008 | Stolpman et al. |
| 2009/0044823 A1* | 2/2009 | Overend .................. A45D 1/28 132/211 |
| 2009/0272732 A1 | 11/2009 | Ptasienski |
| 2010/0124448 A1 | 5/2010 | Beach et al. |
| 2013/0098389 A1* | 4/2013 | Uwano .................. A45D 1/04 29/860 |
| 2014/0369730 A1 | 12/2014 | Bayerle et al. |
| 2015/0335120 A1* | 11/2015 | Moore .................. A45D 1/04 132/211 |
| 2016/0219651 A1 | 7/2016 | Gaulard et al. |
| 2017/0023894 A1 | 1/2017 | Cao et al. |
| 2018/0014618 A1* | 1/2018 | Ohgi .................. A45D 1/04 |
| 2019/0196372 A1 | 6/2019 | Cao et al. |
| 2019/0290877 A1 | 9/2019 | Potharaju et al. |
| 2019/0357318 A1 | 11/2019 | Bassill et al. |
| 2020/0063975 A1 | 2/2020 | Song et al. |
| 2020/0253409 A1* | 8/2020 | Cao .................. H05B 3/141 |
| 2021/0251045 A1* | 8/2021 | Smith .................. H05B 3/283 |
| 2021/0251046 A1* | 8/2021 | Smith .................. H05B 3/748 |

FOREIGN PATENT DOCUMENTS

| | | | |
|---|---|---|---|
| CN | 201076357 Y | 6/2008 | |
| CN | 101327102 A | 12/2008 | |
| EP | 2863769 B1 * | 8/2017 | ............... A45D 1/00 |
| EP | 2696720 B1 | 12/2017 | |
| WO | 1997001259 A1 | 1/1997 | |
| WO | 2006054080 A2 | 5/2006 | |
| WO | 2012139958 A1 | 10/2012 | |

OTHER PUBLICATIONS

International Search Report and Written Opinion of the International Searching Authority dated Apr. 24, 2020 for PCT Application No. PCT/US2020/016926.

International Search Report and Written Opinion of the International Searching Authority dated Jul. 19, 2021 for PCT Application No. PCT/US2021/025721.

Extended European Search Report dated Sep. 29, 2022 for European Patent Application No. 20752962.9.

Non-Final Office Action dated Jan. 3, 2023 for U.S. Appl. No. 17/147,921 (Smith et al.).

EPO machine translation of CN 2847768 Y (Jyayi Electric Technology Co. Ltd.).

Final Office Action dated Apr. 5, 2023 for U.S. Appl. No. 17/147,921 (Smith et al.).

Non-Final Office Action dated Mar. 6, 2023 for U.S. Appl. No. 17/147,907 (Smith et al.).

English translation of Office Action dated May 4, 2023 for China Patent Application No. 2020800126499.

Final Office Action dated Jul. 19, 2023 for U.S. Appl. No. 17/147,907 (Smith et al.).

Non-Final Office Action dated Sep. 29, 2023 for U.S. Appl. No. 17/147,907 (Smith et al.).

Office Action dated Nov. 8, 2023 for Canada Patent Application No. 3,127,690.

* cited by examiner

HAIR IRON HAVING A CERAMIC HEATER

CROSS REFERENCES TO RELATED APPLICATIONS

This application claims priority to U.S. Provisional Patent Application Ser. No. 62/802,945, filed Feb. 8, 2019, entitled "Rapid Warm and Cool Ceramic Heater for Hair iron," the content of which is hereby incorporated by reference in its entirety.

BACKGROUND

1. Field of the Disclosure

The present disclosure relates to a hair iron having a ceramic heater.

2. Description of the Related Art

Many conventional hair irons, such as flat irons, straightening irons, curling irons, crimping irons, etc., suffer from heat lag, which results in an inconvenient amount of time to heat the hair iron for use and to cool the hair iron after use. Prior to use, a user must wait for the device to heat to an effective temperature. After use, the user may need to wait for the device to cool to a safe temperature before storing the device. Because of the relatively long warmup and cooldown times, users often set hair irons on a countertop or the like during heating and cooling. This creates a safety risk to the user and to others, especially children, who may accidentally contact a hot device or who may not recognize that the device is powered on or not yet cooled. Additional safety risks arise when a hair iron is accidentally left powered on.

Prior art hair irons are divided into two main classes: wire heaters and ceramic heaters. Both classes of hair irons generate heat by passing an electrical current through a resistive element (either a wire resistor or a resistor positioned between layers of a ceramic substrate). Both classes of hair irons include, by necessity, substantial thermal mass leading to long warmup and cooldown times. For example, some wire heaters include nichrome wire potted with ceramic cement (for electrical insulation) and placed within cast aluminum. Other wire heaters include nichrome wire wound with an electrically insulative material that surrounds the inside and outside of the winding, and the insulated winding positioned within a steel or aluminum tube (or other formed metal piece), which forms the contact surface that contacts the user's hair during use. Both of these types of wire heater assemblies suffer from long warmup and cooldown times due to high thermal mass provided by the electrical insulation materials and the relatively large metal components.

Conventional ceramic heaters typically include electrically resistive and conductive traces printed on a "green state" (unfired) ceramic substrate. After printing, multiple sheets of the substrate are brought together with the printed resistive and conductive traces positioned internally (i.e., between ceramic substrate layers), and the combined materials are fired to form the ceramic heater. The ceramic substrate shrinks significantly during firing (as much as 10-15%) resulting in a non-uniform pattern of resistive and conductive traces. The ceramic heater is then fitted with one or more coated pieces of metal, which form the contact surface that contacts the user's hair during use. The ceramic substrate surrounding the resistive and conductive traces and the additional metal piece combine to provide relatively high thermal mass and, as a result, long warmup and cooldown times.

Accordingly, a hair iron having a heater with improved thermal efficiency is desired.

SUMMARY

A hair iron according to one example embodiment includes a first arm and a second arras movable relative to each other between an open position and a closed position. A distal segment of the first arm is spaced from a distal segment of the second arm in the open position. The distal segment of the first arm is positioned in close proximity to the distal segment of the second arm in the closed position. A contact surface is positioned on an exterior, such as an exterior of the distal segment, of the first arm for contacting hair during use. The first arm includes a heater having a ceramic substrate and an electrically resistive trace on the ceramic substrate, e.g., on an exterior face of the ceramic substrate. The electrically resistive trace is composed of an electrical resistor material. In some embodiments, the electrically resistive trace includes the electrical resistor material thick film printed on the exterior face of the ceramic substrate after firing of the ceramic substrate. The heater is positioned to supply heat generated by applying an electric current to the electrically resistive trace to the contact surface.

In some embodiments, the electrically resistive trace is positioned on an inner face of the ceramic substrate that faces away from the second arm in the closed position.

Embodiments include those wherein the heater includes one or more glass layers on the exterior face of the ceramic substrate that cover the electrically resistive trace for electrically insulating the electrically resistive trace.

Embodiments include those wherein the heater includes a thermistor that is positioned on the ceramic substrate and in electrical communication with control circuitry of the heater for providing feedback regarding the temperature of the heater to the control circuitry of the heater. In some embodiments, the thermistor is positioned on an inner face of the ceramic substrate that faces away from the second arm in the closed position.

Some embodiments include a sleeve covering an outer face of the heater that faces toward the second arm in the closed position. A portion of the sleeve forms the contact surface. In some embodiments, the sleeve is composed of a thin film of thermally conductive and electrically insulative material. In some embodiments, the sleeve is composed of at least one of a filled or unfilled polyimide.

Embodiments include those wherein the heater is mounted to a heater housing that is positioned on the arm. The heater housing is composed of a plastic material having a maximum service temperature of at least 200 degrees Celsius.

BRIEF DESCRIPTION OF THE DRAWINGS

The accompanying drawings incorporated in and forming a part of the specification illustrate several aspects of the present disclosure and together with the description serve to explain the principles of the present disclosure.

DETAILED DESCRIPTION

In the following description, reference is made to the accompanying drawings where like numerals represent like elements. The embodiments are described in sufficient detail to enable those skilled in the art to practice the present disclosure. It is to be understood that other embodiments may be utilized and that process, electrical, and mechanical changes, etc., may be made without departing from the scope of the present disclosure. Examples merely typify possible variations. Portions and features of some embodiments may be included in or substituted for those of others. The following description, therefore, is not to be taken in a limiting sense and the scope of the present disclosure is defined only by the appended claims and their equivalents.

Figure 1:
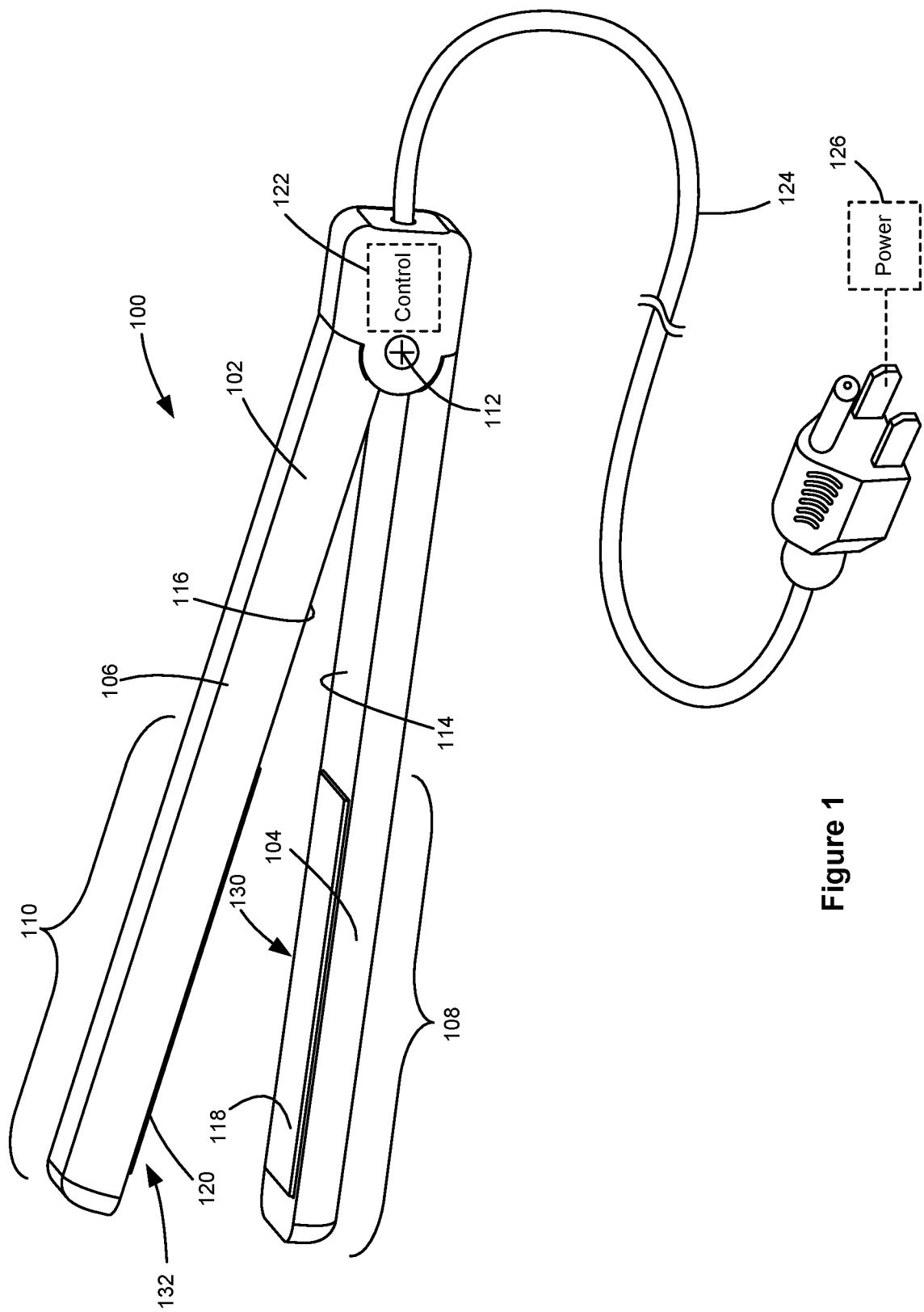
FIG. 1 is a perspective view of a hair iron having arms in an open position according to one example embodiment.
Figure 2:
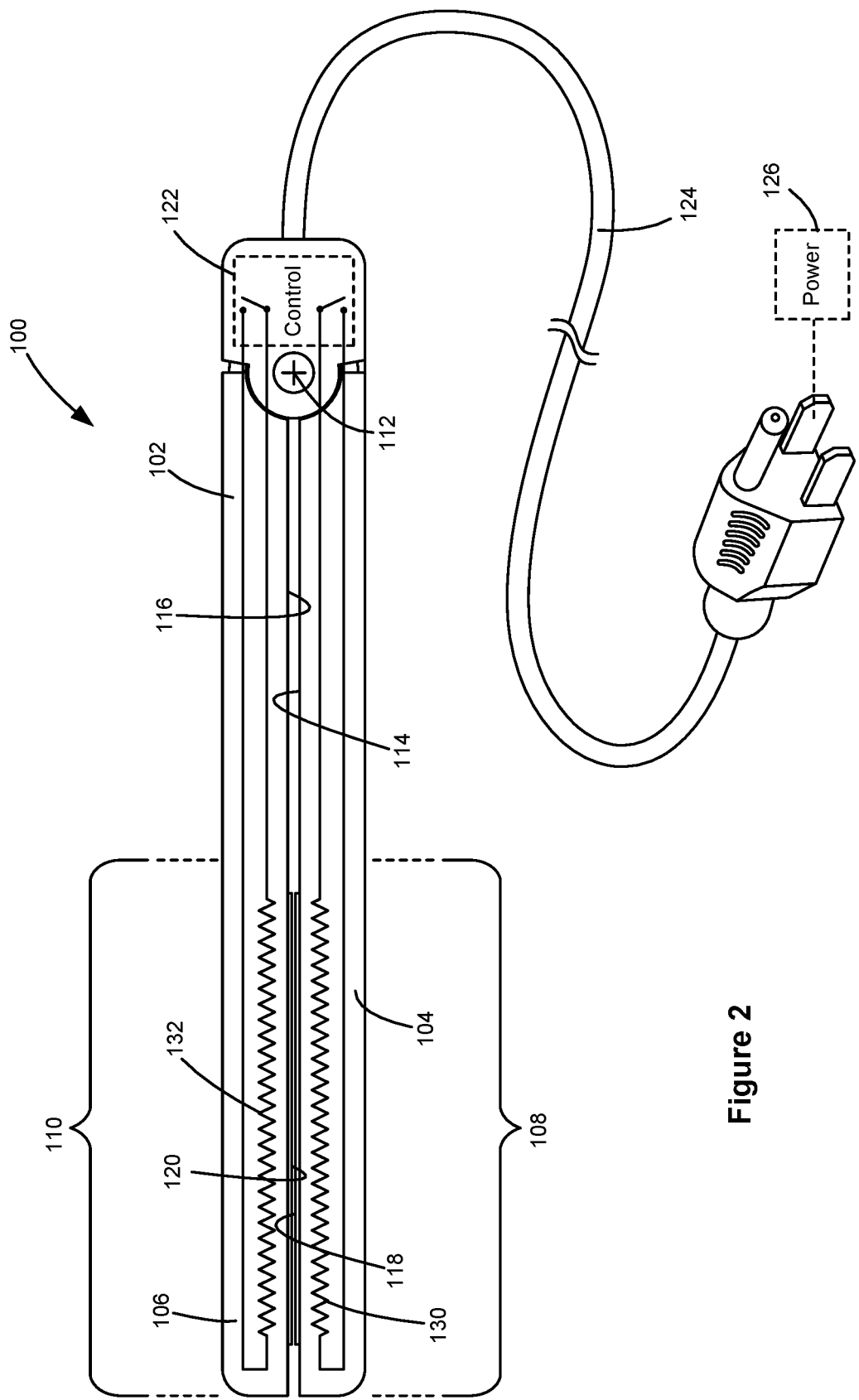
FIG. 2 is a perspective view of the hair iron shown in FIG. 1 with the arms in a closed position.

Referring now to the drawings and particularly to FIGS. 1 and 2, a hair iron 100 is shown according to one example embodiment. Hair iron 100 may include an appliance such as a flat iron, straightening iron, curling iron, crimping iron, or other similar device that applies heat and pressure to a user's hair in order to change the structure or appearance of the user's hair. Hair iron 100 includes a housing 102 that forms the overall support structure of hair iron 100. Housing 102 may be composed of, for example, a plastic that is thermally insulative and electrically insulative and that possesses relatively high heat resistivity and dimensional stability and low thermal mass. Example plastics include polybutylene terephthalate (PBT) plastics, polycarbonate/acrylonitrile butadiene styrene (PC/ABS) plastics, polyethylene terephthalate (PET) plastics, including glass-filled versions of each. In addition to forming the overall support structure of hair iron 100, housing 102 also provides electrical insulation and thermal insulation in order to provide a safe surface for the user to contact and hold during operation of hair iron 100.

Hair iron 100 includes a pair of arms 104, 106 that are movable between an open position shown in FIG. 1 where distal segments 108, 110 of arms 104, 106 are spaced apart from each other and a closed position shown in FIG. 2 where distal segments 108, 110 of arms 104 106 are in contact, or close proximity (e.g., within a few millimeters or less, including in contact), with each other. For example, in the embodiment illustrated, arms 104, 106 are pivotable relative to each other about a pivot axis 112 between the open position and the closed position. Hair iron 100 may include a bias member (not shown), such as one or more springs, that biases one or both of arms 104, 106 toward the open position such that user actuation is required to overcome the bias applied to arms 104, 106 to bring arms 104, 106 together to the closed position.

Hair iron 100 includes a heater positioned on an inner side 114, 116 of one or both of arms 104, 106. Inner sides 114, 116 of arms 104, 106 include the portions of arms 104, 106 that face each other when arms 104 106 are in the closed position shown in FIG. 2. In the example embodiment illustrated, each arm 104. 106 includes a respective heater 130, 132 positioned on or within the arm 104, 106. Heaters 130, 132 supply heat to respective contact surfaces 118, 120 on arms 104, 106. Each contact surface 118, 120 is positioned on inner side 114, 116 of distal segment 108, 110 of the corresponding arm 104, 106. Contact surfaces 118, 120 may be formed directly by a surface of each heater 130, 132 or formed by a material covering each heater 130, 132, such as a shield or sleeve. Contact surfaces 118, 120 are positioned to directly contact and transfer heat to a user's hair upon the user positioning a portion of his or her hair between arms 104, 106 and positioning arms 104, 106 in the closed position. Contact surfaces 118, 120 are positioned to mate against one another in a relatively flat orientation when arms 104, 106 are in the closed position in order to maximize the surface area available for contacting the user's hair.

Hair iron 100 includes control circuitry 122 configured to control the temperature of each heater 130, 132 by selectively opening or closing a circuit supplying electrical current to resistors of each heater 130, 132 (shown schematically in FIG. 2). Where hair iron 100 includes two heaters 130, 132, control circuitry 122 may be configured to control each heater 130. 132 independently or to control both heaters 130, 132 jointly. Open loop or, preferably, closed loop control may be utilized as desired. Control circuitry 122 may include a microprocessor, a microcontroller, an application-specific integrated circuit, and/or other form of integrated circuit. In the embodiment illustrated, hair iron 100 includes a power cord 124 for connecting hair iron 100 to an external voltage source 126. In other embodiments, hair iron 100 may include an internal battery as desired.

Figure 3:
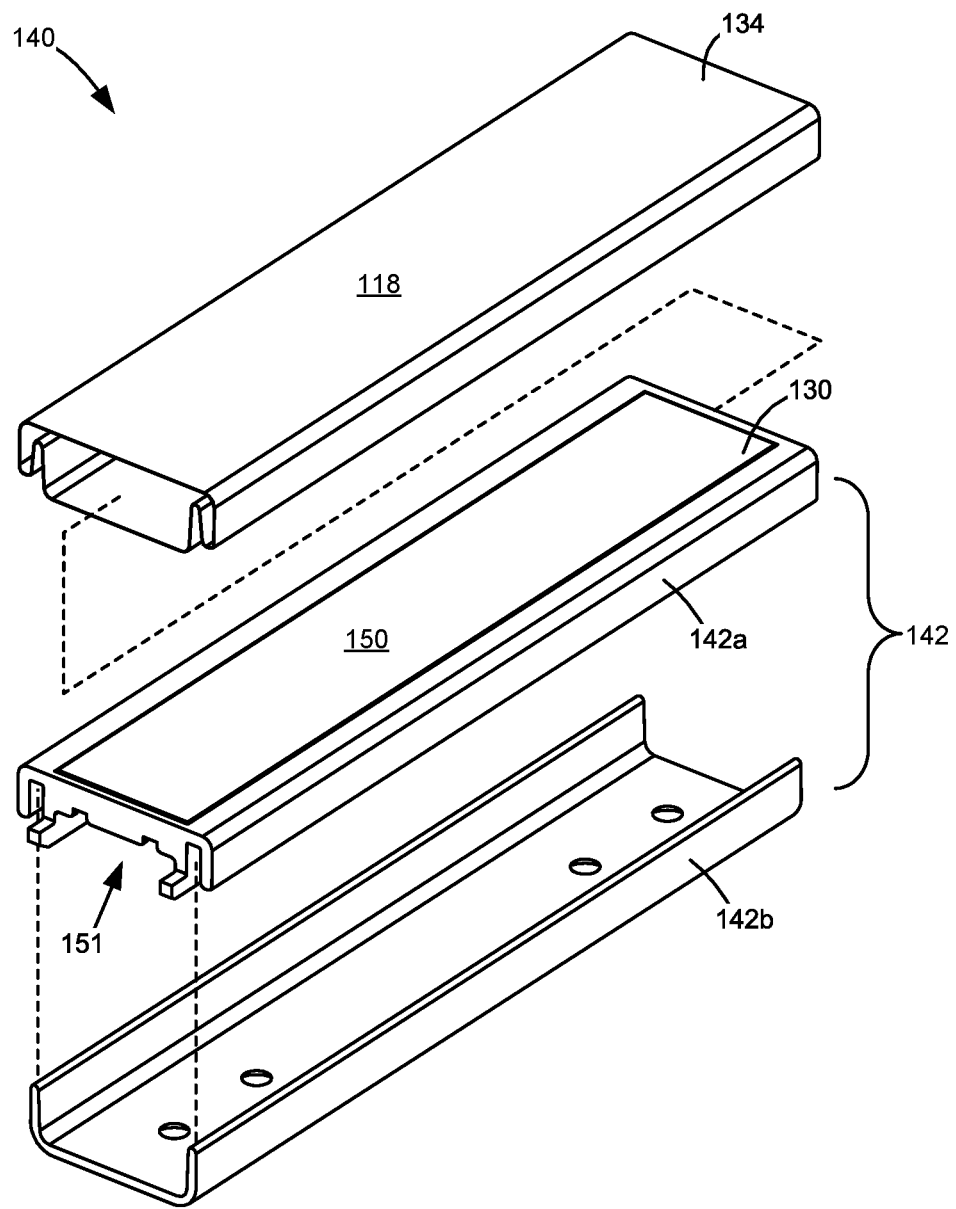
FIG. 3 is an exploded perspective view of a heater assembly of the hair iron according to a first example embodiment.

FIG. 3 shows an example heater assembly 140 that includes heater 130 and a sleeve 134 for use on arm 104. A substantially identical heater assembly including heater 132 and corresponding sleeve may be used on arm 106. Heater assembly 140 includes heater 130, sleeve 134 and a heater housing 142. Heater 130 is mounted to heater housing 142 with heater housing 142 physically supporting heater 130. Heater housing 142 is, in turn, mounted to a portion of housing 102 within arm 104. In the embodiment illustrated, heater housing 142 includes a first housing portion 142a and a second housing portion 142b. Heater 130 is mounted to first housing portion 142a. Fasteners (not shown), such as screws, mount second housing portion 142b to first housing portion 142a and to housing 102, Heater housing 142 may be composed of, for example, a plastic that is thermally insulative and electrically insulative and that possesses relatively high heat resistivity and dimensional stability and low thermal mass. Due to the proximity to heater 130, heater housing 142 is preferably composed of a plastic capable of resisting thermal degradation and maintaining sufficient strength and stiffness at high temperatures, including plastics having a maximum service temperature of 200 degrees Celsius or more. Example plastics include liquid crystal polymer (LCP) plastics, polyether ether ketone (PEEK) plastics and polyphenylene sulfide (PPS) plastics, including glass-filled versions of each.

Heater 130 includes an outer face 150 that is exposed from and faces away from heater housing 142 as shown in FIG. 3. Heater 130 includes an inner face 151 that is positioned proximate to an interior portion of heater housing 142, for example, between first housing portion 142a and second housing portion 142b as shown in FIG. 3. When arms 104, 106 are in the closed position, outer face 150 faces toward opposite arm 106 and inner face 151 faces away from opposite arm 106. As discussed above, in some embodiments, outer face 150 of heater 130 forms contact surface 118. In other embodiments, such as the example embodiment shown in FIG. 3, sleeve 134 is positioned against outer face 150 of heater 130 and forms contact surface 118. In the embodiment illustrated, sleeve 134 wraps around heater housing 142 and covers outer face 150 of heater 130. Sleeve 134 is positioned in contact with, or in close proximity to, outer face 150 of heater 130 in order to transfer heat from outer face 150 of heater 130 to the user's hair during use. Sleeve 134 is composed of a thin film (e.g., less than 0.1 mm thick) material. In one embodiment, sleeve 134 is composed of a thermally conductive and electrically insulative material, such as boron nitride filled polyimide. The thermal conductivity and relative thinness of sleeve 134 result in a relatively low thermal mass, which reduces the amount of time required to heat and cool sleeve 134. In other embodiments, e.g., where decreased thermal conductivity is acceptable, sleeve 134 may be composed of unfilled to polyimide. In other embodiments, e.g., where electrical conductivity is acceptable, sleeve 134 may be composed of graphite filled polyimide. Sleeve 134 aids in protecting heater 130 from damage and also provides a relatively low friction contact surface 118 during use.

Figure 4A:
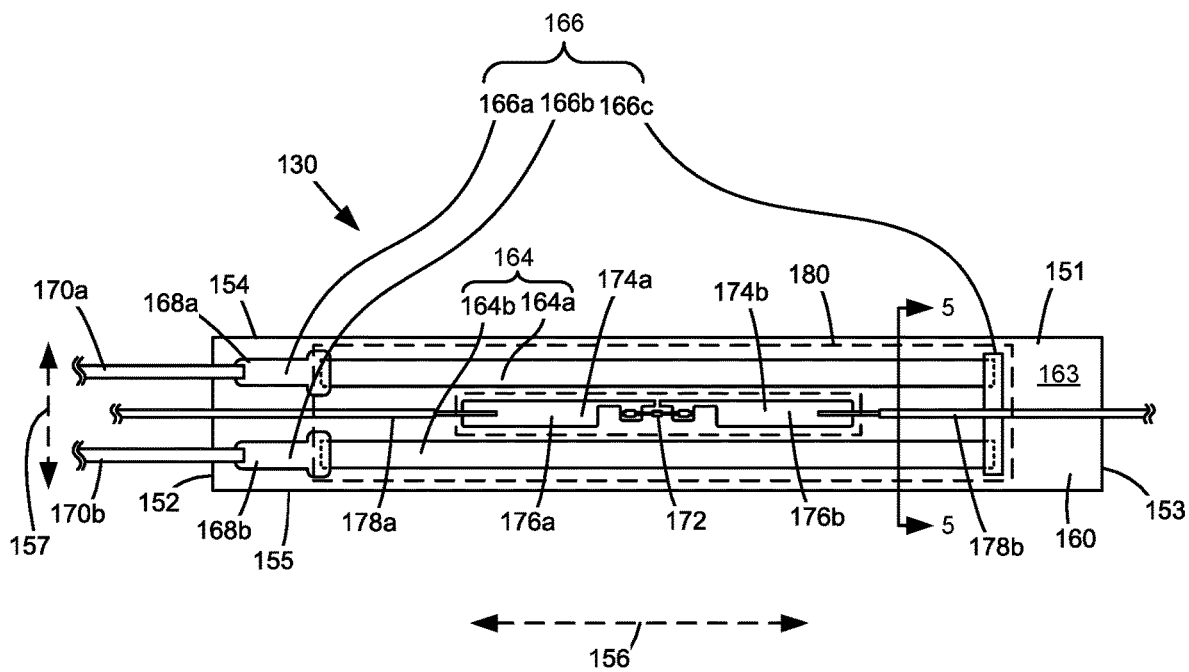
FIGS. 4A and 4B are plan views of an inner face and an outer face, respectively, of a heater of the heater assembly shown in FIG. 3.
Figure 4B:
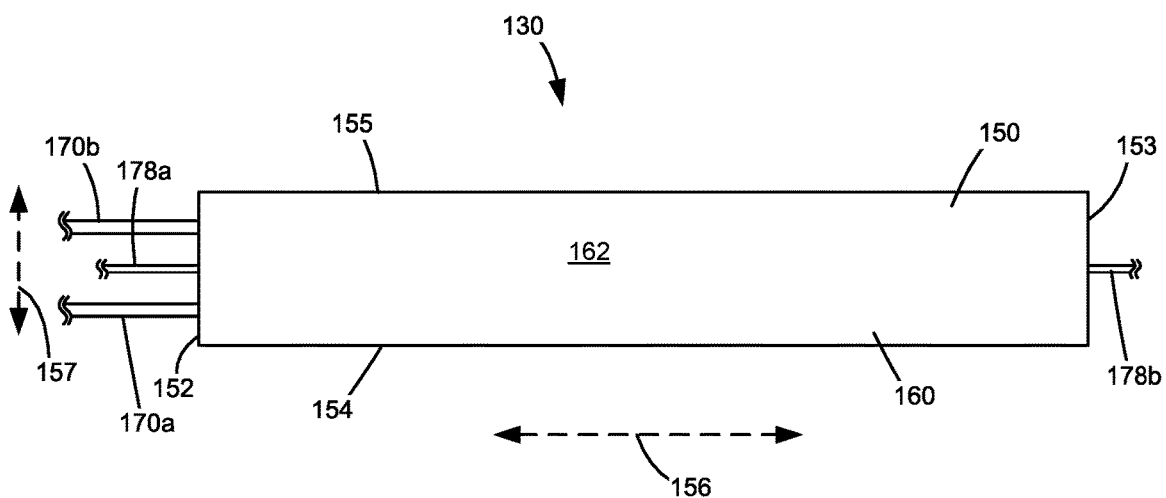

FIGS. 4A and 4B show heater 130 removed from heater housing 142. FIG. 4A shows inner face 151 of heater 130, and FIG. 4B shows outer face 150 of heater 130. Heater 132 may be substantially identical to heater 130. In the embodiment illustrated, outer face 150 and inner face 151 are bordered by four sides or edges 152, 153, 154, 155 each having a smaller surface area than outer face 150 and inner face 151. In this embodiment, heater 130 includes a longitudinal dimension 156 that extends from edge 152 to edge 153 and a lateral dimension 157 that extends from edge 154 to edge 155. Heater 130 also includes an overall thickness 158 (FIG. 5) measured from outer face 150 to inner face 151.

Heater 130 includes one or more layers of a ceramic substrate 160, such as aluminum oxide (e.g., commercially available 96% aluminum oxide ceramic). Where heater 130 includes a single layer of ceramic substrate 160, a thickness of ceramic substrate 160 may range from, for example, 0.5 mm to 1.5 mm, such as 1.0 mm. Where heater 130 includes multiple layers of ceramic substrate 160, each layer may have a thickness ranging from, for example, 0.5 mm to 1.0 mm, such as 0.635 mm. In some embodiments, a length of ceramic substrate along longitudinal dimension 156 may range from, for example, 80 mm to 120 mm. In some embodiments, a width of ceramic substrate 160 along lateral dimension 157 may range from, for example, 15 mm to 24 mm, such as 17 mm or 22.2 mm. Ceramic substrate 160 includes an outer face 162 that is oriented toward outer face 150 of heater 130 and an inner face 163 that is oriented toward inner face 151 of heater 130. Outer face 162 and inner face 163 of ceramic substrate 160 are positioned on exterior portions of ceramic substrate 160 such that if more than one layer of ceramic substrate 160 is used, outer face 162 and inner face 163 are positioned on opposed external faces of the ceramic substrate 160 rather than on interior or intermediate layers of ceramic substrate 160.

In the example embodiment illustrated, outer face 150 of heater 130 is formed by outer face 162 of ceramic substrate 160 as shown in FIG. 4B. In this embodiment, inner face 163 of ceramic substrate 160 includes a series of one or more electrically resistive traces 164 and electrically conductive traces 166 positioned thereon. Resistive traces 164 include a suitable electrical resistor material such as, for example, silver palladium (e.g., blended 70/30 silver palladium). Conductive traces 166 include a suitable electrical conductor material such as, for example, silver platinum. In the embodiment illustrated, resistive traces 164 and conductive traces 166 are applied to ceramic substrate 160 by way of thick film printing. For example, resistive traces 164 may include a resistor paste having a thickness of 10-13 microns when applied to ceramic substrate 160, and conductive traces 166 may include a conductor paste having a thickness of 9-15 microns when applied to ceramic substrate 160. Resistive traces 164 form the heating element of heater 130 and conductive traces 166 provide electrical connections to and between resistive traces 164 in order to supply an electrical current to each resistive trace 164 to generate heat.

In the example embodiment illustrated, heater 130 includes a pair of resistive traces 164a, 164b that extend substantially parallel to each other (and substantially parallel to edges 154, 155) along longitudinal dimension 156 of heater 130. Heater 130 also includes a pair of conductive traces 166a, 166b that each form a respective terminal 168a, 168b of heater 130. Cables or wires 170a, 170b are connected to terminals 168a, 168b in order to electrically connect resistive traces 164 and conductive traces 166 to, for example, control circuitry 122 and voltage source 126 in order to selectively close the circuit formed by resistive traces 164 and conductive traces 166 to generate heat. Conductive trace 166a directly contacts resistive trace 164a, and conductive trace 166b directly contacts resistive trace 164b. Conductive traces 166a, 166b are both positioned adjacent to edge 152 in the example embodiment illustrated, but conductive traces 166a, 166b may be positioned in other suitable locations on ceramic substrate 160 as desired. In this embodiment, heater 130 includes a third conductive trace 166c that electrically connects resistive trace 164a to resistive trace 164b. Portions of resistive traces 164a, 164b obscured beneath conductive traces 166a, 166b, 166c in FIG. 4A are shown in dotted line. In this embodiment, current input to heater 130 at, for example, terminal 168a by way of conductive trace 166a passes through, in order, resistive trace 164a, conductive trace 166c, resistive trace 164b, and conductive trace 166b where it is output from heater 130 at terminal 168b. Current input to heater 130 at terminal 168b travels in reverse along the same path.

In some embodiments, heater 130 includes a thermistor 172 positioned in close proximity to a surface of heater 130 in order to provide feedback regarding the temperature of heater 130 to control circuitry 122. In some embodiments, thermistor 172 is positioned on inner face 163 of ceramic substrate 160. In the example embodiment illustrated, thermistor 172 is welded directly to inner face 163 of ceramic substrate 160. In this embodiment, heater 130 also includes a pair of conductive traces 174a, 174b that are each electrically connected to a respective terminal of thermistor 172 and that each form a respective terminal 176a, 176b. Cables or wires 178a, 178b are connected to terminals 176a, 176b in order to electrically connect thermistor 172 to, for example, control circuitry 122 in order to provide closed loop control of heater 130. In the embodiment illustrated, thermistor 172 is positioned at a central location of inner face 163 of ceramic substrate 160, between resistive traces 164a, 164b and midway from edge 152 to edge 153. In this embodiment, conductive traces 174a, 174b are also positioned between resistive traces 164a, 164b with conductive trace 174a positioned toward edge 152 from thermistor 172 and conductive trace 174b positioned toward edge 153 from thermistor 172. However, thermistor 172 and its corresponding conductive traces 174a, 174b may be positioned in other suitable locations on ceramic substrate 160 so long as they do not interfere with the positioning of resistive traces 164 and conductive traces 166.

Figure 5:
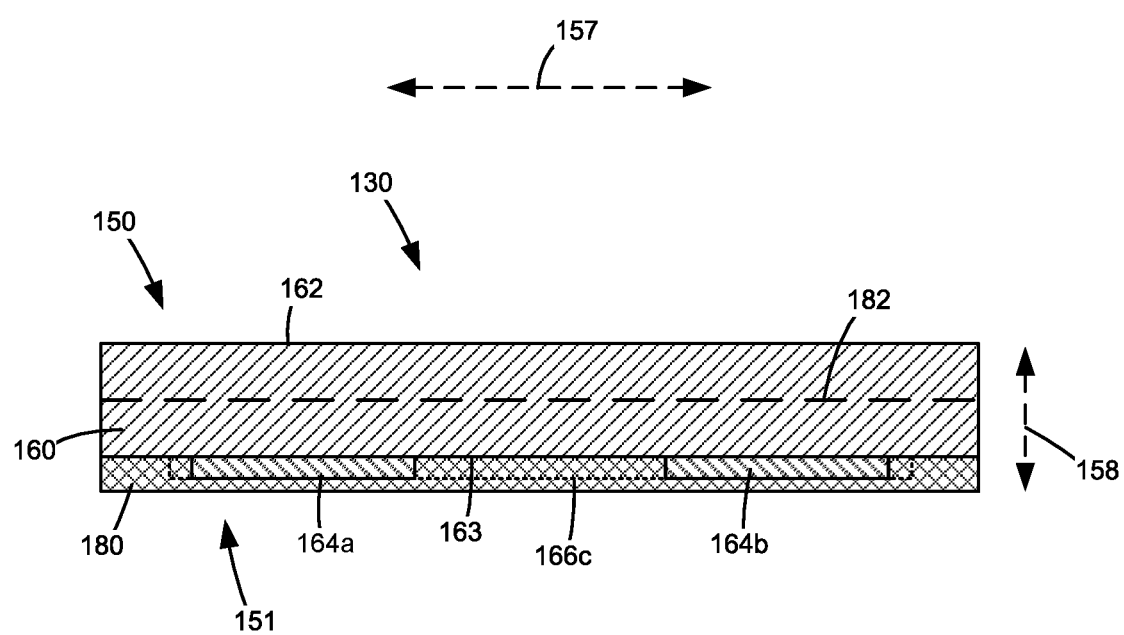
FIG. 5 is a cross-sectional view of the heater shown in FIGS. 4A and 4B taken along line 5-5 in FIG. 4A.

FIG. 5 is a cross-sectional view of heater 130 taken along line 5-5 in FIG. 4A. With reference to FIGS. 4A, 4B and 5, in the embodiment illustrated, heater 130 includes one or more layers of printed glass 180 on inner face 163 of ceramic substrate 160. In the embodiment illustrated, glass 180 covers resistive traces 164a, 164b, conductive trace 166c, and portions of conductive traces 166a, 166b in order to electrically insulate such features to prevent electric shock or arcing. The borders of glass layer 180 are shown in dashed line in FIG. 4A. In this embodiment, glass 180 does not cover thermistor 172 or conductive traces 174a, 174b because the relatively low voltage applied to such features presents a lower risk of electric shock or arcing. An overall thickness of glass 180 may range from, for example, 70-80 microns. FIG. 5 shows glass 180 covering resistive traces 164a, 164b and adjacent portions of ceramic substrate 160 such that glass 180 forms the majority of inner face 151 of heater 130. Outer face 162 of ceramic substrate 160 is shown forming outer face 150 of heater 130 as discussed above. Conductive trace 166c, which is obscured from view in FIG. 5 by portions of glass 180, is shown in dotted line. FIG. 5 depicts a single layer of ceramic substrate 160. However, ceramic substrate 160 may include multiple layers as depicted by dashed line 182 in FIG. 5.

Heater 130 may be constructed by way of thick film printing. For example, in one embodiment, resistive traces 164 are printed on fired (not green state) ceramic substrate 160, which includes selectively applying a paste containing resistor material to ceramic substrate 160 to through a patterned mesh screen with a squeegee or the like. The printed resistor is then allowed to settle on ceramic substrate 160 at room temperature. The ceramic substrate 160 having the printed resistor is then heated at, for example, approximately 140-160 degrees Celsius for a total of approximately 30 minutes, including approximately 10-15 minutes at peak temperature and the remaining time ramping up to and down from the peak temperature, in order to dry the resistor paste and to temporarily fix resistive traces 164 in position. The ceramic substrate 160 having temporary resistive traces 164 is then heated at, for example, approximately 850 degrees Celsius for a total of approximately one hour, including approximately 10 minutes at peak temperature and the remaining time ramping up to and down from the peak temperature, in order to permanently fix resistive traces 164 in position. Conductive traces 166 and 174a, 174b are then printed on ceramic substrate 160, which includes selectively applying a paste containing conductor material in the same manner as the resistor material. The ceramic substrate 160 having the printed resistor and conductor is then allowed to settle, dried and fired in the same manner as discussed above with respect to resistive traces 164 in order to permanently fix conductive traces 166 and 174a, 174b in position. Glass layer(s) 180 are then printed in substantially the same manner as the resistors and conductors, including allowing the glass layer(s) 180 to settle as well as drying and firing the glass layer(s) 180. In one embodiment, glass layer(s) 180 are fired at a peak temperature of approximately 810 degrees Celsius, slightly lower than the resistors and conductors. Thermistor 172 is then mounted to ceramic substrate 160 in a finishing operation with the terminals of thermistor 172 directly welded to conductive traces 174a, 174b.

Thick film printing resistive traces 164 and conductive traces 166 on fired ceramic substrate 160 provides more uniform resistive and conductive traces in comparison with conventional ceramic heaters, which include resistive and conductive traces printed on green state ceramic. The improved uniformity of resistive traces 164 and conductive traces 166 provides more uniform heating across contact surface 118 as well as more predictable heating of heater 130.

Preferably, heaters 130 are produced in an array for cost efficiency. Heaters 130 are separated into individual heaters 130 after the construction of all heaters 130 is completed, including firing of all components and any applicable finishing operations. In some embodiments, individual heaters 130 are separated from the array by way of fiber laser scribing. Fiber laser scribing tends to provide a more uniform singulation surface having fewer microcracks along the separated edge in comparison with conventional carbon dioxide laser scribing.

While the example embodiment illustrated in FIGS. 3-5 includes resistive traces 164 and thermistor 172 positioned on inner face 163 of ceramic substrate 160, in other embodiments, resistive traces 164 and/or thermistor 172 may be positioned on outer face 162 of ceramic substrate 160 along with corresponding conductive traces as needed to establish electrical connections thereto. Glass 180 may cover the resistive traces and conductive traces on outer face 162 and/or inner face 163 of ceramic substrate 160 as desired in order to electrically insulate such features.

Figure 6:
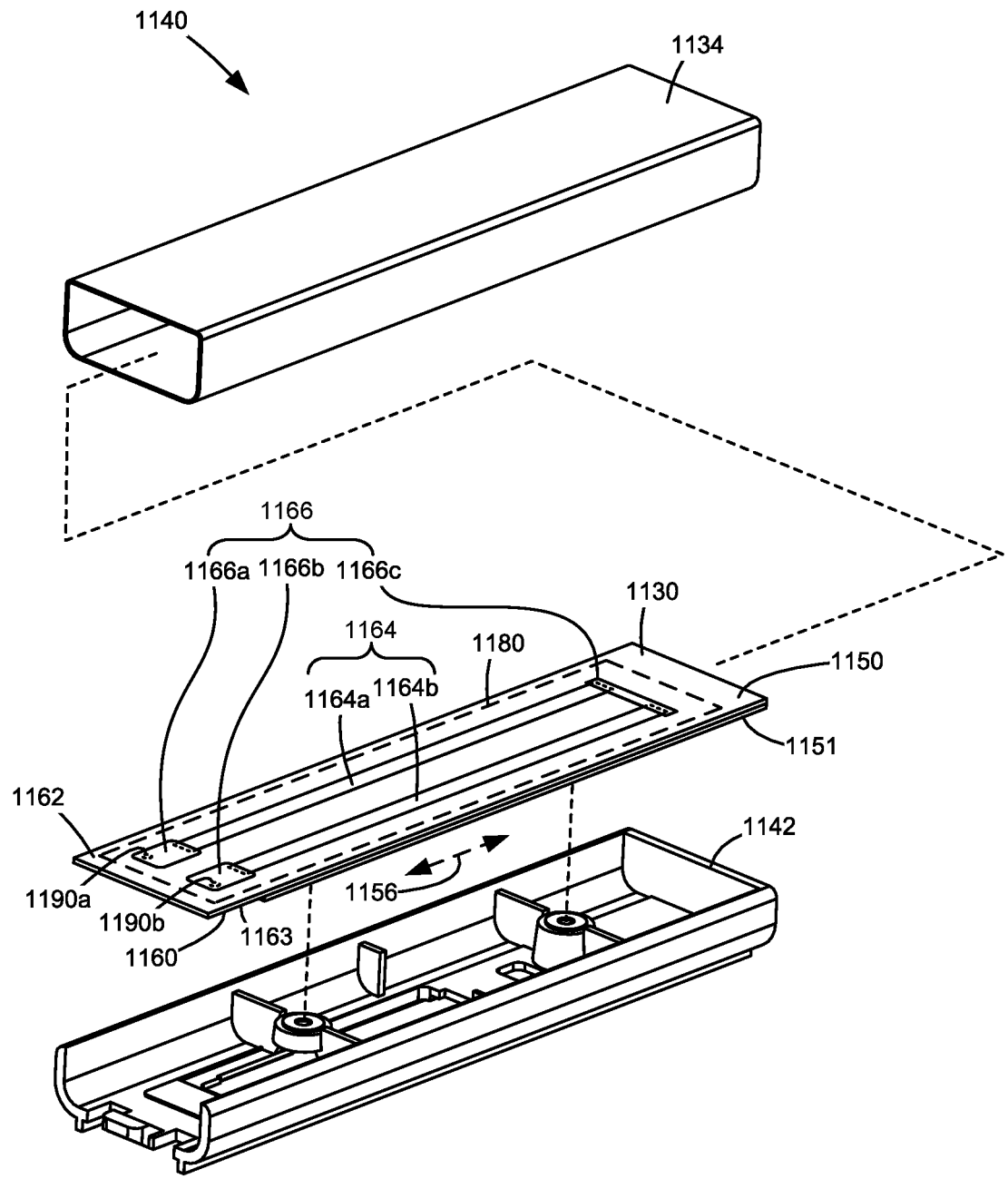
FIG. 6 is an exploded perspective view of a heater assembly of the hair iron according to a second example embodiment.
Figure 7:
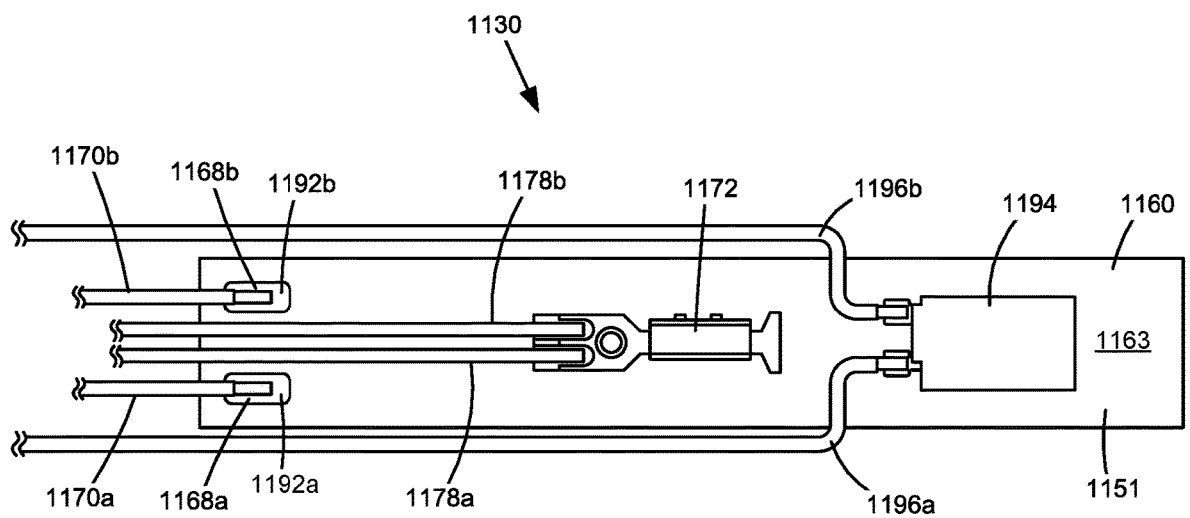
FIG. 7 is a plan view of an inner face of a heater of the heater assembly shown in FIG. 6.

FIGS. 6 and 7 show a heater assembly 1140 suitable for use with hair iron 100 according to another example embodiment. With reference to FIG. 6, heater assembly 1140 includes a heater 1130 mounted to a heater housing 1142 similar to heater 130 and heater housing 142 discussed above. Heater 1130 includes an outer face 1150 that is exposed from and faces away from heater housing 1142 and an inner face 1151 that is positioned proximate to an interior portion of heater housing 1142 as discussed above. Heater assembly 1140 also includes a sleeve 1134, similar to sleeve 134 discussed above, that covers heater 1130.

Heater 1130 includes one or more layers of ceramic substrate 1160 as discussed above. Ceramic substrate 1160 includes an outer face 1162 that is oriented toward outer face 1150 of heater 1130 and an inner face 1163 that is oriented toward inner face 1151 of heater 1130. In contrast with the embodiment shown in FIGS. 3-5, in the example embodiment illustrated in FIGS. 6 and 7, electrically resistive traces 1164 and electrically conductive traces 1166 are positioned on outer face 1162 of ceramic substrate 1160, rather than inner face 1163. Resistive traces 1164 and conductive traces 1166 may be applied by way of thick film printing as discussed above.

As shown in FIG. 6, in the example embodiment illustrated, heater 1130 includes a pair of resistive traces 1164a, 1164b on outer face 1162 of a ceramic substrate 1160. Resistive traces 1164a, 1164b extend substantially parallel to each other along a longitudinal dimension 1156 of heater 1130. Heater 1130 also includes three conductive traces 1166a, 1166b, 1166c positioned on outer face 1162 of ceramic substrate 1160. Conductive trace 1166a directly contacts resistive trace 1164a, and conductive trace 1166b directly contacts resistive trace 1164b. Conductive traces 1166a, 1166b are both positioned adjacent to a common edge of ceramic substrate 1160 in the example embodiment illustrated. Conductive trace 1166c is positioned adjacent to an opposite edge of ceramic substrate 1160 (relative to conductive traces 1166a, 1166b) and electrically connects resistive trace 1164a to resistive trace 1164b. Portions of resistive traces 1164a, 1164b obscured beneath conductive traces 1166a, 1166b, 1166c in FIG. 6 are shown in dotted line.

In the embodiment illustrated, heater 1130 includes a pair of vias 1190a, 1190b that are formed as through-holes substantially filled with conductive material extending through ceramic substrate 1160 from outer face 1162 to inner face 1163. Vias 1190a, 1190b electrically connect conductive traces 1166a, 1166b to corresponding conductive traces on inner face 1163 of ceramic substrate 1160 as discussed below.

In the embodiment illustrated, heater 1130 includes one or more layers of printed glass 1180 on outer face 1162 of ceramic substrate 1160. In the embodiment illustrated, glass 1180 covers resistive traces 1164a, 1164b and conductive traces 1166a, 1166b, 1166c in order to electrically insulate these features. The borders of glass layer 1180 are shown in dashed line in FIG. 6.

FIG. 7 shows inner face 1151 of heater 1130 according to one example embodiment. In this embodiment, heater 1130 includes a pair of conductive traces 1192a, 1192b positioned on inner face 1163 of ceramic substrate 1160 that that each form a respective terminal 1168a, 1168b of heater 1130. Each conductive trace 1192a, 1192b on inner face 1163 of ceramic substrate 1160 is electrically connected to a respective conductive trace 1166a, 1166b on outer face 1162 of ceramic substrate 1160 by a respective via 1190a, 1190b. Cables or wires 1170a, 1170b are connected to (e.g., directly welded to) terminals 1168a, 1168b in order to supply current to resistive traces 1164a, 1164b to generate heat. In this embodiment, current input to heater 1130 at, for example, terminal 1168a by way of conductive trace 1192a passes through, in order, via 1190a, conductive trace 1166a, resistive trace 1164a, conductive trace 1166c, resistive trace 1164b, conductive trace 1166b, via 1190b and conductive trace 1192b where it is output from heater 1130 at terminal 1168b. Current input to heater 1130 at terminal 1168b travels in reverse along the same path.

In the example embodiment illustrated, heater 1130 includes a thermistor 1172 positioned in close proximity to inner face 1163 of ceramic substrate 1160 in order to provide feedback regarding the temperature of heater 1130 to control circuitry 122. In this embodiment, thermistor 1172 is not directly attached to ceramic substrate 1160 but is instead held against inner face 1163 of ceramic substrate 1160 by a mounting clip (not shown) or other form of fixture or attachment mechanism. Cables or wires 1178a, 1178b are connected to (e.g., directly welded to) respective terminals of thermistor 1172 in order to electrically connect thermistor 1172 to, for example, control circuitry 122. Of course, thermistor 1172 of heater 1130 may alternatively be directly welded to ceramic substrate 1160 as discussed above with respect to thermistor 172 of heater 130. Similarly, thermistor 172 of heater 130 may be held against ceramic substrate 160 by a fixture instead of directly welded to ceramic substrate 160.

In the example embodiment illustrated, heater 1130 also includes a thermal cutoff 1194, such as a bi-metal thermal cutoff, positioned on inner face 1163 of ceramic substrate 1160. Cables or wires 1196a, 1196b are connected to respective terminals of thermal cutoff 1194 in order to provide electrical connections to thermal cutoff 1194. Thermal cutoff 1194 is electrically connected in series with the heating circuit formed by resistive traces 1164 and conductive traces 1166 permitting thermal cutoff 1194 to open the heating circuit formed by resistive traces 1164 and conductive traces 1166 upon detection by thermal cutoff 1194 of a temperature that exceeds a predetermined amount. In this manner, thermal cutoff 1194 provides additional safety by preventing overheating of heater 1130. Of course, heater 130 discussed above may also include a thermal cutoff as desired.

While not illustrated, it will be appreciated that inner face 1163 of ceramic substrate 1160 may include one or more glass layers in order to electrically insulate portions of inner face 1151 of heater 1130 as desired.

Figure 8:
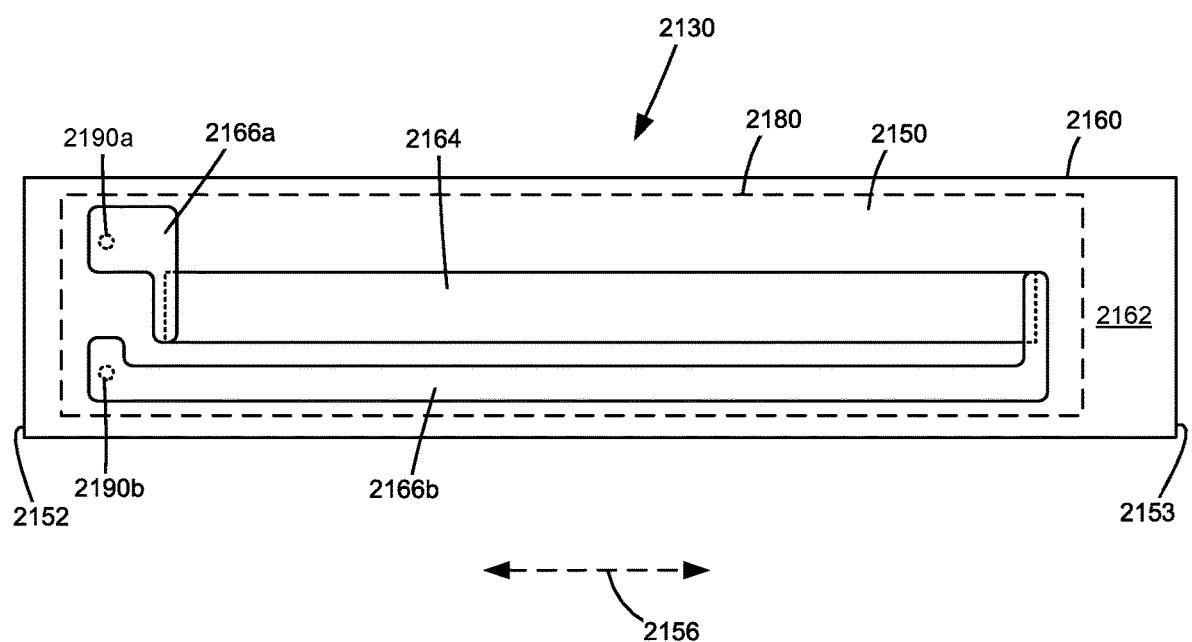
FIG. 8 is a plan view of an outer face of a heater according to a thud example embodiment.

FIG. 8 shows a heater 2130 suitable for use with hair iron 100 according to another example embodiment. FIG. 8 shows an outer face 2150 of heater 2130. In one embodiment, an inner face of heater 2130 is substantially the same as inner face 1151 of heater 1130 shown in FIG. 7. Heater 2130 includes one or more layers of a ceramic substrate 2160 as discussed above. FIG. 8 shows an outer face 2162 of ceramic substrate 2160.

In the example embodiment illustrated, heater 2130 includes a single resistive trace 2164 on outer face 2162 of ceramic substrate 2160. Resistive trace 2164 extends along a longitudinal dimension 2156 of heater 2130. Heater 2130 also includes a pair of conductive traces 2166a, 2166b positioned on outer face 2162 of ceramic substrate 2160. Each conductive trace 2166a, 2166b directly contacts a respective end of resistive trace 2164. Conductive trace 2166a contacts resistive trace 2164 near a first longitudinal edge 2152 of heater 2130. Conductive trace 2166b contacts resistive trace 2164 near a second longitudinal edge 2153 of heater 2130 and extends from the point of contact with resistive trace 2164 to a position next to conductive trace 2166a. Portions of resistive trace 2164 obscured beneath conductive traces 2166a, 2166b in FIG. 8 are shown in dotted line.

In the embodiment illustrated, heater 2130 includes a pair of vias 2190a, 2190b that are formed as through-holes substantially tilled with conductive material extending through ceramic substrate 2160 as discussed above with respect to heater 1130. Vias 2190a, 2190b electrically connect conductive traces 2166a, 2166b to corresponding conductive traces on the inner face of ceramic substrate 2160 as discussed above.

In the embodiment illustrated, heater 2130 includes one or more layers of printed glass 2180 on outer face 2162 of ceramic substrate 2160. Glass 2180 covers resistive trace 2164 and conductive traces 2166a, 2166b in order to electrically insulate these features as discussed above. The borders of glass layer 2180 are shown in dashed line in FIG. 8.

It will appreciated that the example embodiments illustrated and discussed above are not exhaustive and that the heater of the present disclosure may include resistive and conductive traces in many different geometries, including resistive traces on the outer face and/or the inner face of the heater, as desired. Other components (e.g., a thermistor) may be positioned on either the outer face or the inner face of the heater as desired.

The present disclosure provides a ceramic heater having a low thermal mass in comparison with the heaters of conventional hair irons. In particular, thick film printed resistive traces on an exterior face (outer or inner) of the ceramic substrate provides reduced thermal mass in comparison with resistive traces positioned internally between multiple sheets of ceramic. The use of a thin film, thermally conductive sleeve (such as a polyimide sleeve) also provides reduced thermal mass in comparison with metal holders, guides, etc. The low thermal mass of the ceramic heater of the present disclosure allows the heater, in some embodiments, to heat to an effective temperature for use in a matter of seconds (e.g., less than 5 seconds), significantly faster than conventional hair irons. The low thermal mass of the ceramic heater of the present disclosure also allows the heater, in some embodiments, to cool to a safe temperature after use in a matter of seconds (e.g., less than 5 seconds), again, significantly faster than conventional hair irons.

Further, embodiments of the hair iron of the present disclosure operate at a more precise and more uniform temperature than conventional hair irons because of the closed loop temperature control provided by the thermistor in combination with the relatively uniform thick film printed resistive and conductive traces. The low thermal mass of the ceramic heater and improved temperature control permit greater energy efficiency in comparison with conventional hair irons. The rapid warmup and cooldown times of the ceramic heater of the present disclosure also provide increased safety by reducing the amount of time the hair iron is hot but unused. The improved temperature control and temperature uniformity further increase safety by reducing the occurrence of overheating. The improved temperature control and temperature uniformity also improve the performance of the hair iron of the present disclosure.

The foregoing description illustrates various aspects of the present disclosure. It is not intended to be exhaustive. Rather, it is chosen to illustrate the principles of the present disclosure and its practical application to enable one of ordinary skill in the art to utilize the present disclosure, including its various modifications that naturally follow. All modifications and variations are contemplated within the scope of the present disclosure as determined by the appended claims. Relatively apparent modifications include combining one or more features of various embodiments with features of other embodiments.

The invention claimed is:

1. A hair iron, comprising:
   a first arm and a second arm movable relative to each other between an open position and a closed position, a distal segment of the first arm is spaced from a distal segment of the second arm in the open position, the distal segment of the first arm is positioned in close proximity to the distal segment of the second arm in the closed position;
   a contact surface positioned on an exterior of the distal segment of the first arm for contacting hair during use;
   the first arm includes a heater having a ceramic substrate and an electrically resistive trace on an exterior face of the ceramic substrate, the heater is positioned to supply heat generated by applying an electric current to the electrically resistive trace to the contact surface; and
   a sleeve covering an outer face of the heater that faces toward the second arm in the closed position, wherein a portion of the sleeve forms the contact surface.

2. The hair iron of claim 1, wherein the electrically resistive trace includes an electrical resistor material thick film printed on the exterior face of the ceramic substrate after firing of the ceramic substrate.

3. The hair iron of claim 1, wherein the electrically resistive trace is positioned on an inner exterior face of the ceramic substrate that faces away from the second arm in the closed position.

4. The hair iron of claim 1, wherein the heater includes one or more glass layers on the exterior face of the ceramic substrate that cover the electrically resistive trace for electrically insulating the electrically resistive trace.

5. The hair iron of claim 1, wherein the heater includes a thermistor that is positioned on the ceramic substrate and in electrical communication with control circuitry of the heater for providing feedback regarding a temperature of the heater to the control circuitry of the heater.

6. The hair iron of claim 5, wherein the thermistor is positioned on an inner exterior face of the ceramic substrate that faces away from the second arm in the closed position.

7. The hair iron of claim 6, wherein the electrically resistive trace is positioned on the inner exterior face of the ceramic substrate.

8. The hair iron of claim 1, wherein the sleeve is composed of a thin film of thermally conductive and electrically insulative material.

9. The hair iron of claim 1, wherein the sleeve is composed of at least one of a filled or unfilled polyimide.

10. The hair iron of claim 1, wherein the heater is mounted to a heater housing that is positioned on the first arm, the heater housing is composed of a plastic material having a maximum service temperature of at least 200 degrees Celsius.

11. A hair iron, comprising:
    a first arm and a second arm movable relative to each other between an open position and a closed position, a distal portion of the first arm is spaced from a distal portion of the second arm in the open position, the distal portion of the first arm is positioned in close proximity to the distal portion of the second arm in the closed position;
    a contact surface positioned on an exterior of the first arm for contacting hair during use;
    a heater having a ceramic substrate and an electrical resistor material thick film printed on a surface of the ceramic substrate after firing of the ceramic substrate, the heater is positioned to supply heat generated by applying an electric current to the electrical resistor material to the contact surface; and
    a sleeve covering an outer face of the heater that faces toward the second arm in the closed position, wherein a portion of the sleeve forms the contact surface.

12. The hair iron of claim 11, wherein the electrical resistor material is positioned on an exterior face of the ceramic substrate.

13. The hair iron of claim 12, wherein the electrical resistor material is positioned on an inner exterior face of the ceramic substrate that faces away from the second arm in the closed position.

14. The hair iron of claim 12, wherein the heater includes one or more glass layers on the exterior face of the ceramic substrate that cover the electrical resistor material for electrically insulating the electrical resistor material.

15. The hair iron of claim 11, wherein the heater includes a thermistor that is positioned on the ceramic substrate and in electrical communication with control circuitry of the heater for providing feedback regarding a temperature of the heater to the control circuitry of the heater.

16. The hair iron of claim 15, wherein the thermistor is positioned on an inner exterior face of the ceramic substrate that faces away from the second arm in the closed position.

17. The hair iron of claim 16, wherein the electrical resistor material is positioned on the inner exterior face of the ceramic substrate.

18. The hair iron of claim 11, wherein the sleeve is composed of a thin film of thermally conductive and electrically insulative material.

19. The hair iron of claim 11, wherein the sleeve is composed of at least one of a filled or unfilled polyimide.

20. The hair iron of claim 11, wherein the heater is mounted to a heater housing that is positioned on the first arm, the heater housing is composed of a plastic material having a maximum service temperature of at least 200 degrees Celsius.

\* \* \* \* \*